(12) United States Patent
Seol et al.

(10) Patent No.: US 12,142,697 B2
(45) Date of Patent: *Nov. 12, 2024

(54) TWO-DIMENSIONAL MATERIAL-BASED WIRING CONDUCTIVE LAYER CONTACT STRUCTURES, ELECTRONIC DEVICES INCLUDING THE SAME, AND METHODS OF MANUFACTURING THE ELECTRONIC DEVICES

(71) Applicant: Samsung Electronics Co., Ltd., Suwon-si (KR)

(72) Inventors: Minsu Seol, Seoul (KR); Hyeonjin Shin, Suwon-si (KR); Minseok Yoo, Suwon-si (KR); Minhyun Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/483,058

(22) Filed: Oct. 9, 2023

(65) Prior Publication Data

US 2024/0038903 A1 Feb. 1, 2024

Related U.S. Application Data

(63) Continuation of application No. 17/014,127, filed on Sep. 8, 2020, now Pat. No. 11,830,952.

(30) Foreign Application Priority Data

Mar. 31, 2020 (KR) ........................ 10-2020-0039431

(51) Int. Cl.
*H01L 29/786* (2006.01)
*H01L 21/02* (2006.01)
(Continued)

(52) U.S. Cl.
CPC .. *H01L 29/78696* (2013.01); *H01L 21/02417* (2013.01); *H01L 21/02568* (2013.01);
(Continued)

(58) Field of Classification Search
CPC ........... H01L 21/0237; H01L 21/02417; H01L 21/02428; H01L 21/02568; H01L 21/441;
(Continued)

(56) References Cited

U.S. PATENT DOCUMENTS

2016/0190244 A1 6/2016 Lee et al.
2017/0345944 A1 11/2017 Lin et al.
(Continued)

FOREIGN PATENT DOCUMENTS

KR 10-2019-0003223 A 1/2019
KR 102031594 B1 10/2019

OTHER PUBLICATIONS

Chris D. English et al., 'Improved Contacts to MoS₂ Transistors by Ultra-High Vacuum Metal Deposition' *Nano Letters*, vol. 16, 2016, p. 3824-3830.
(Continued)

*Primary Examiner* — Cheung Lee
(74) *Attorney, Agent, or Firm* — Harness, Dickey & Pierce, P.L.C.

(57) ABSTRACT

Provided are two-dimensional material (2D)-based wiring conductive layer contact structures, electronic devices including the same, and methods of manufacturing the electronic devices. A 2D material-based field effect transistor includes a substrate; first to third 2D material layers on the substrate; an insulating layer on the first 2D material layer; a source electrode on the second 2D material layer; a drain electrode on the third 2D material layer; and a gate electrode on the insulating layer. The first 2D material layer is configured to exhibit semiconductor characteristics, and
(Continued)

the second and third 2D material layers are metallic 2D material layers. The first 2D material layer may include a first channel layer of a 2D material and a second channel layer of a 2D material. The first 2D material layer may partially overlap the second and third 2D material layers.

19 Claims, 26 Drawing Sheets

(51) Int. Cl.
    *H01L 21/8234*     (2006.01)
    *H01L 29/06*     (2006.01)
    *H01L 29/16*     (2006.01)
    *H01L 29/24*     (2006.01)
    *H01L 29/41*     (2006.01)
    *H01L 29/417*     (2006.01)
    *H01L 29/45*     (2006.01)
    *H01L 29/66*     (2006.01)

(52) U.S. Cl.
    CPC .. *H01L 21/823412* (2013.01); *H01L 29/0665* (2013.01); *H01L 29/1606* (2013.01); *H01L 29/24* (2013.01); *H01L 29/413* (2013.01); *H01L 29/41733* (2013.01); *H01L 29/45* (2013.01); *H01L 29/66969* (2013.01)

(58) Field of Classification Search
    CPC ......... H01L 21/823412; H01L 29/0665; H01L 29/1037; H01L 29/1606; H01L 29/24; H01L 29/413; H01L 29/41733; H01L 29/45; H01L 29/458; H01L 29/66742; H01L 29/66969; H01L 29/778; H01L 29/78618; H01L 29/78681; H01L 29/78696

See application file for complete search history.

(56) References Cited

U.S. PATENT DOCUMENTS

| | | |
|---|---|---|
| 2018/0151700 A1 | 5/2018 | Lin et al. |
| 2019/0019882 A1 | 1/2019 | Lin et al. |
| 2019/0378715 A1 | 12/2019 | Lin et al. |

OTHER PUBLICATIONS

Yuan Liu et al., 'Van der Waals heterostructures and devices' *Nature Reviews—Materials*, vol. 1, Sep. 2016.

Sajedeh Manzeli et al., '2D transition metal dichalcogenides' *Nature Reviews: Materials*, vol. 2, No. 17033, Jun. 2017.

Saien Xie et al., 'Coherent, atomically thin transition-metal dichalcogenide superlattices with engineered strain' *Science*, vol. 359, 2018, pp. 1131-1136.

Zhiquan Yuan et al., 'Interfacing 2D Semiconductors with Functional Oxides: Fundamentals, Properties, and Applications' *Crystals*, vol. 7, No. 265, 2017.

Daniel Kopperud, New 2D Transistor Material Made Using Precision Lasers *Institute for Basic Science: Research News*, published online Aug. 7, 2015, retrieved Dec. 3, 2020.

Deji Akinwande et al., 'Graphene and two-dimensional materials for silicon technology' *Nature*, vol. 573, Sep. 2019, pp. 507-518.

Wei Liu et al., 'Role of Metal Contacts in Designing High-Performance Monolayer n-Type WSe2 Field Effect Transistors' *Nano Letters*, vol. 13, 2013, pp. 1983-1990.

TWO-DIMENSIONAL MATERIAL-BASED WIRING CONDUCTIVE LAYER CONTACT STRUCTURES, ELECTRONIC DEVICES INCLUDING THE SAME, AND METHODS OF MANUFACTURING THE ELECTRONIC DEVICES

CROSS-REFERENCE TO RELATED APPLICATION

This application is a continuation of U.S. application Ser. No. 17/014,127, filed on Sep. 8, 2020, which claims the benefit of Korean Patent Application No. 10-2020-0039431, filed on Mar. 31, 2020, in the Korean Intellectual Property Office, the disclosures of each which are incorporated herein in their entirety by reference.

BACKGROUND

1. Field

The present disclosure relates to electronic devices, and more particularly, to two-dimensional material-based wiring conductive layer contact structures, electronic devices including the same, and methods of manufacturing the electronic devices.

2. Description of Related Art

As the degree of integration of semiconductor devices increases, the size of semiconductor elements included in the semiconductor devices becomes smaller. Accordingly, a charge mobility rapidly decreases when the thickness of an existing three-dimensional bulk material (e.g., Si and GaAs) decreases, and a problem, such as a short-channel effect, occurs when a channel length of the existing three-dimensional bulk material is short. Thus, miniaturization of semiconductor devices is limited.

Therefore, a transistor using a two-dimensional (2D) material as a channel has been recently introduced. A 2D material has a thin thickness of a few nanometers, maintains a high charge mobility and is less affected by a short-channel effect, and thus, may be useful for miniaturization of semiconductor devices. However, performance degradation due to a contact resistance between a 2D material and other components may occur in a transistor using a 2D material as a channel.

SUMMARY

Provided is two-dimensional (2D) material-based wiring conductive layer contact structures configured to lower a contact resistance between a 2D material and a conductive layer.

Provided are electronic devices configured to have excellent operating characteristics due to inclusion of the contact structure.

Provided are methods of manufacturing the electronic devices.

Additional aspects will be set forth in part in the description which follows and, in part, will be apparent from the description, or may be learned by practice of the presented example embodiments of the disclosure.

According to some example embodiments, a 2D material-based wiring conductive layer contact structure includes: a semiconducting 2D material wiring; a conductive layer on the semiconducting 2D material wiring; and a metallic 2D material layer between the semiconducting 2D material wiring and the conductive layer. The metallic 2D material layer may be in contact with the semiconducting 2D material wiring and the conductive layer.

In some embodiments, the semiconducting 2D material wiring may include a transition metal dichalcogenide (TMD) or black phosphorene (BP). The semiconducting 2D material wiring may have a certain doping concentration. The metallic 2D material layer may include a 2D material configured to exhibit metallicity, semi-metallicity, or superconductivity. According to some example embodiments, the semiconducting 2D material wiring and the metallic 2D material layer may include 2D materials different from each other. According to some example embodiments, the semiconducting 2D material wiring and the metallic 2D material layer may include a same material, and phases of the materials of the semiconducting 2D material wiring and the metallic 2D material layer may be different from each other.

In some embodiments, the metallic 2D material layer may include graphene.

In some embodiments, the conductive layer may directly contact a first surface of the metallic 2D material layer, the semiconductor 2D material wiring may directly contact a second surface of the metallic 2D material layer, and the first surface of the metallic 2D material layer may be different than the second surface of the metallic 2D material layer.

According to some example embodiments, a 2D material-based field effect transistor includes: a substrate; a plurality of 2D materials of the substrate, the plurality of 2D material layers including a first 2D material layer, a second 2D material layer, and a third 2D material layer; an insulating layer on the first 2D material layer; a source electrode on the second 2D material layer; a drain electrode on the third 2D material layer; and a gate electrode on the insulating layer. The first 2D material layer may be configured to exhibit semiconductor characteristics, and the second and third 2D material layers may be metallic 2D material layers.

In some embodiments, the first 2D material layer may include a first channel layer and a second channel layer. The first channel layer may include a 2D material and the second channel layer may include a 2D material. The first channel layer and the second channel layer may be vertically stacked. The first channel layer and the second channel layer may be arranged in parallel not to horizontally overlap each other.

In some embodiments, the first 2D material layer may partially overlap the second 2D material layer and the third 2D material layer. The first 2D material layer may include a TMD layer or a BP layer. The metallic 2D material layer may include a 2D material configured to exhibit metallicity, semi-metallicity, and superconductivity. According to some example embodiments, a component of the first 2D material layer may be different from components of the second and third 2D material layers. According to some example embodiments, a component of the first 2D material layer may be the same as components of the second and third 2D material layers, but a phase of the first 2D material layer may be different from phases of the second and third 2D material layers. The second 2D material layer and the third 2D material layer may include a same 2D material or different 2D materials from each other. One of the first and second channel layers may extend below one of the second and third 2D material layers, and the other one of the first and second channel layers may extend below the other one of the second and third 2D material layers. The first 2D material layer may extend below the second and third 2D material layers. The metallic 2D material layer may include a TMD layer.

According to some example embodiments, a 2D material-based field effect transistor includes: a first 2D material layer configured to exhibit semiconductor characteristics; an insulating layer connected to the first 2D material layer; a second 2D material layer and a third 2D material layer connected to the first 2D material layer, the second 2D material layer and the third 2D material layer being metallic 2D material layers and being spaced apart from each other; a source electrode on the second 2D material layer; a drain electrode on the third 2D material layer; and a gate electrode connected to the insulating layer, the gate electrode spaced apart from the source electrode and the drain electrode.

In some embodiments, the first 2D material layer may include a transition metal dichalcogenide (TMD) layer or a black phosphorene (BP) layer.

In some embodiments, the insulating layer may include a first surface opposite a second surface, the first 2D material layer may be connected to the first surface of the insulating layer, and the gate electrode may be connected to the second surface of the insulating layer.

According to some example embodiments, a method of manufacturing a 2D material-based field effect transistor includes: forming a 2D channel on a substrate, the 2D channel configured to exhibit semiconductor characteristics; forming a first metallic 2D material layer in contact with a first side of the 2D channel; forming a second metallic 2D material layer in contact with a second side of the 2D channel; forming a source electrode on the first metallic 2D material layer; forming a drain electrode on the second metallic 2D material layer; and forming a gate electrode between the source electrode and the drain electrode. The gate electrode may be spaced apart from the 2D channel.

According to some example embodiments, the forming the 2D channel may include directly growing the 2D channel on the substrate. According to some example embodiments, the forming of the 2D channel may include: directly growing the 2D channel on an other substrate different from the substrate to provide a directly grown 2D channel; and transferring the directly grown 2D channel onto the substrate.

According to some example embodiments, the 2D channel may be grown on the entire upper surface of the substrate, and the first and second metallic 2D material layers may be grown on the 2D channel.

According to some example embodiments, a portion of the 2D channel may be grown onto the first and second metallic 2D material layers by adjusting horizontal and vertical growth rates of the 2D channel. The forming the first and second metallic 2D material layers may include growing the first and second metallic 2D material layers onto the 2D channel by adjusting horizontal and vertical growth rates of the first and second metallic 2D material layers.

According to some example embodiments, the forming the 2D channel may include: growing a portion of the 2D channel on the substrate; and growing a remainder of the 2D channel on the portion of the 2D channel. The portion of the 2D channel may extend below the first metallic 2D material layer. The remainder of the 2D channel may extend below the second metallic 2D material layer.

According to some example embodiments, a 2D material of the 2D channel may be different from 2D materials of the first and second metallic 2D material layers. According to some example embodiments, the 2D channel and the first and second metallic 2D material layers may include the same 2D material, but phases of each of the materials of the 2D channel and the first and second metallic 2D material layers may be different from each other. The first and second metallic 2D material layers may include 2D material layers different from each other.

According to some example embodiments, the forming the 2D channel may include doping the 2D channel.

BRIEF DESCRIPTION OF THE DRAWINGS

The above and other aspects, features, and effects of certain embodiments of the disclosure will be more apparent from the following description taken in conjunction with the accompanying drawings, in which.

DETAILED DESCRIPTION

Figure 1:
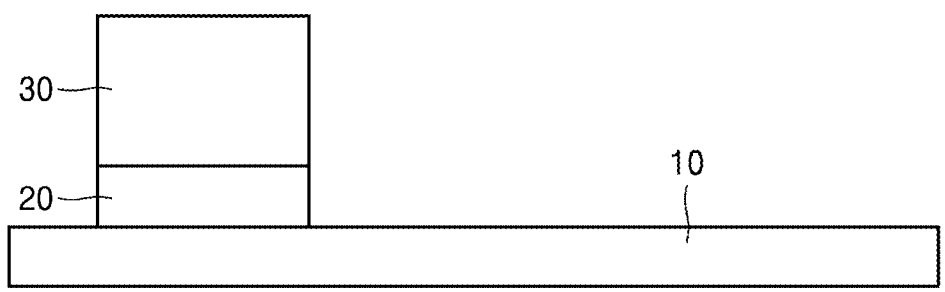
FIGS. 1 and 2 are cross-sectional views illustrating a contact form between a two-dimensional (2D) material wiring and a conductive layer according to some example embodiments.

Reference will now be made in detail to example embodiments, some of which are illustrated in the accompanying drawings, wherein like reference numerals refer to like elements throughout. In this regard, the present embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a two-dimensional material-based wiring conductive layer contact structure, an electronic device including the same, and a method of manufacturing the electronic device according to some example embodiments are described in detail with reference to the accompanying drawings. In this operation, the thickness of layers or areas shown in drawings may be somewhat exaggerated for clarity of the specification. Also, the following example embodiments described below are merely illustrative, and various modifications are possible from some example embodiments of the present disclosure. In addition, in a layer structure described below, the expression "upper" or "above" may include not only one placed directly on something in contact therewith, but also one placed over something in a non-contact manner. The electronic device includes a semiconductor device. In the following description, like reference numeral of each drawing denotes like element.

FIG. 1 shows a contact form of a two-dimensional (2D) material wiring and a conductive layer according to some example embodiments.

Referring to FIG. 1, a first 2D material layer 20 and a conductive layer 30 are sequentially stacked on a wiring 10.

The wiring 10 may be a 2D material layer or may include a 2D material layer. The 2D material layer used as the wiring 10 may include the same material as or a different material from the first 2D material layer 20. Material properties of the wiring 10 and the first 2D material layer 20 may be different from each other. In some example embodiments, the wiring 10 may be a semiconducting wiring, that is, a wiring exhibiting semiconductor characteristics, and the first 2D material layer 20 may exhibit metallicity, semi-metallicity, and superconductivity. In some example embodiments, the wiring 10 and the first 2D material layer 20 may include physically the same 2D material, but phases of the materials may be different from each other. For example, while the wiring 10 may have a first phase, the first 2D material layer 20 may have a second phase different from the first phase. A 2D material having the first phase may exhibit semiconductor characteristics, whereas a 2D material having the second phase may exhibit metallicity. In some example embodiments, the wiring 10 may be a first transition metal dichalcogenide (TMD) layer or may include a first TMD. In some example embodiments, the wiring 10 may be a black phosphorene (BP) layer or may include BP. The first TMD layer may be, for example, a 2D material layer including any one selected from the group consisting of Mo, W, Ti, Ni, Ta, Hf, and Zr, and any one selected from the group consisting of S, Se, and Te. In some example embodiments, the wiring 10 may be a doped wiring. A doping concentration of the wiring 10 may vary depending on a usage of the wiring 10. When the wiring 10 is used as a channel of a field effect transistor, the doping concentration for the wiring 10 may be 1 e12/cm$^2$ or less, but the disclosure is not limited thereto. The first 2D material layer 20 may be a second TMD layer or may include the second TMD layer. In some example embodiments, the second TMD layer may be a 2D material layer including any one selected from the group consisting of Mo, W, Ti, Ni, Ta, Hf, Zr, Nb, Pt, Pd, Au, and V and any one selected from the group consisting of S, Se, and Te. In some example embodiments, the first 2D material layer 20 may be a material layer or an alloy layer including a 2D material exhibiting metallicity and a 2D material exhibiting semiconductor characteristics. The 2D material exhibiting metallicity may be graphene or may include graphene. The wiring 10 and the conductive layer 30 are in contact with each other via the first 2D material layer 20, and thus, contact resistance between the wiring 10 and the conductive layer 30 may be lowered than a case that the wiring 10 and the conductive layer 30 are in direct contact with each other. Accordingly, heat generation of a contact area between the wiring 10 and the conductive 30 may be reduced, and signal transmission characteristics may be enhanced. The conductive layer 30 may be an electronic layer of an electronic device or a conductive wiring layer connecting layers or a layer transmitting an electrical signal. In some example embodiments, the conductive layer 30 may be used as a source and drain of a 2D material-based transistor.

Figure 2:
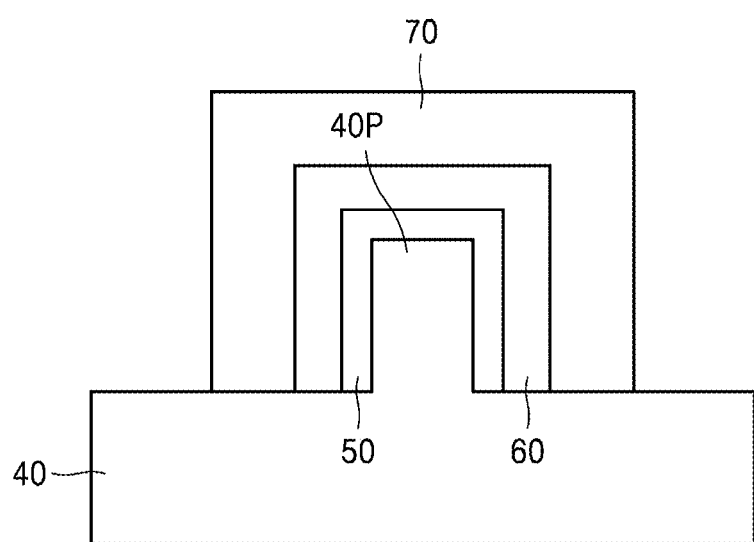

FIG. 2 shows a contact form between a 2D material-based wiring and a conductive layer according to some example embodiments.

Referring to FIG. 2, a substrate 40 includes a protrusion 40P extending in a direction perpendicular to an upper surface of the substrate 40. The protrusion 40P may be a structure with a large aspect ratio (e.g., in a range of 5 to 10, 5 to 20, or more), for example, the protrusion 40P may have a fin shape. The protrusion 40P is covered by a wiring 50. In other words, a side surface and an upper surface of the protrusion 40P are covered by the wiring 50. The wiring 50 may be in contact with an upper surface of the substrate 40 around the protrusion 40P. The wiring 50 may be the same material as the wiring 10 of FIG. 1. A side surface and an upper surface of the wiring 50 may be covered by a 2D material layer 60. The 2D material layer 60 may be the same material as the first 2D material layer 20 of FIG. 1. A side surface and an upper surface of the 2D material layer 60 may be covered by a conductive layer 70. The conductive layer 70 may be the same material layer as the conductive layer 30 of FIG. 1.

A contact structure of the wirings 10 and 50 and the conductive layers 30 and 70 described in FIG. 1 or 2 may be applied to various electronic devices.

FIGS. 3, 4, 5, 6, 7, 8, 9, and 10 show 2D material-based field effect transistors (hereinafter, referred to as transistors) as an example of an electronic device to which the contact structure of the wiring 10 and the conductive layer 30 illustrated in FIG. 1 is applied.

Figure 3:
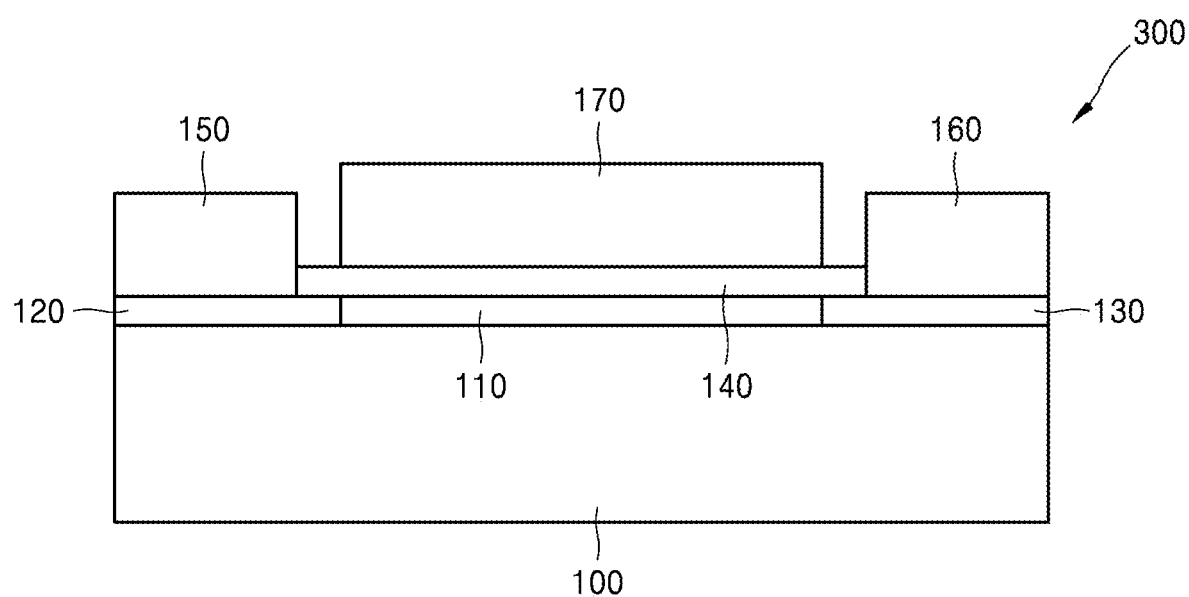
FIGS. 3, 4, 5, 6, 7A, 7B, 8A, 8B, 9, and 10 are cross-sectional views illustrating various electronic devices to which the technical idea of the contact between the 2D material wiring of FIG. 1 or 2 and the conductive layer is applied.

FIG. 3 shows a first transistor 300.

Referring to FIG. 3, first to third 2D material layers 110, 120, and 130 are present on a substrate 100. The substrate 100 may be an insulating substrate. The first 2D material layer 110 may be a 2D channel. The first 2D material layer 110 is placed between the second 2D material layer 120 and the third 2D material layer 130. The first to third 2D material layers 110, 120, and 130 are in contact with each other, and are arranged not to overlap each other. In some example embodiments, the thickness of the first to third 2D material layers 110, 120, and 130 may be the same from each other. In some example embodiments, the thickness of the first to third 2D material layers 110, 120, and 130 may be different from each other. For example, each of the second and third 2D material layers 120 and 130 may be thicker than the first 2D material layer 110. The first 2D material layer 110 may be a channel layer. The first 2D material layer 110 may be the same material as a 2D material used as the wiring of FIG. 1. The second 2D material layer 120 and the third 2D material layer 130 may or may not be the same material layer. The second 2D material layer 120 and the third 2D material layer 130 may be the same material layer as the first 2D material layer 20 of FIG. 1 having metallicity. Accordingly, when the first 2D material layer 110 is referred to as a channel layer, the second 2D material layer 120 may be referred to as a first metallic 2D material layer, and the third 2D material layer 130 may be referred to as a second metallic 2D material layer. An insulating layer 140 is provided on the first 2D material layer 110. The insulating layer 140 may be a gate insulating layer. The insulating layer 140 covers the entire first 2D material layer 110, and covers a portion of the second 2D material layer 120, and a portion of the third 2D material layer 130. The insulating layer 140 may be in direct contact with the entire upper surface of the first 2D material layer 110. The insulating layer 140 may extend onto the second and third 2D material layers 120 and 130 to be in direct contact with portions of the second and third 2D material layers 120 and 130. A source electrode 150 is present on the second 2D material layer 120. A drain electrode 160 is present on the third 2D material layer 130. The source electrode 150 may be in direct contact with the second 2D material layer 120. The drain electrode 160 may be in direct contact with the third 2D material layer 130. The insulating layer 140 may be located between the source electrode 150 and the drain electrode 160, and may be in direct contact with the source and drain electrodes 150 and 160. A gate electrode 170 is formed on the insulating layer 140. The gate electrode 170 is provided on the first 2D material layer 110. The gate electrode 170 may face the first 2D material layer 110 with the insulating layer 140 interposed therebetween. The gate electrode 170 is separated from the source and drain electrodes 150 and 160.

Figure 4:
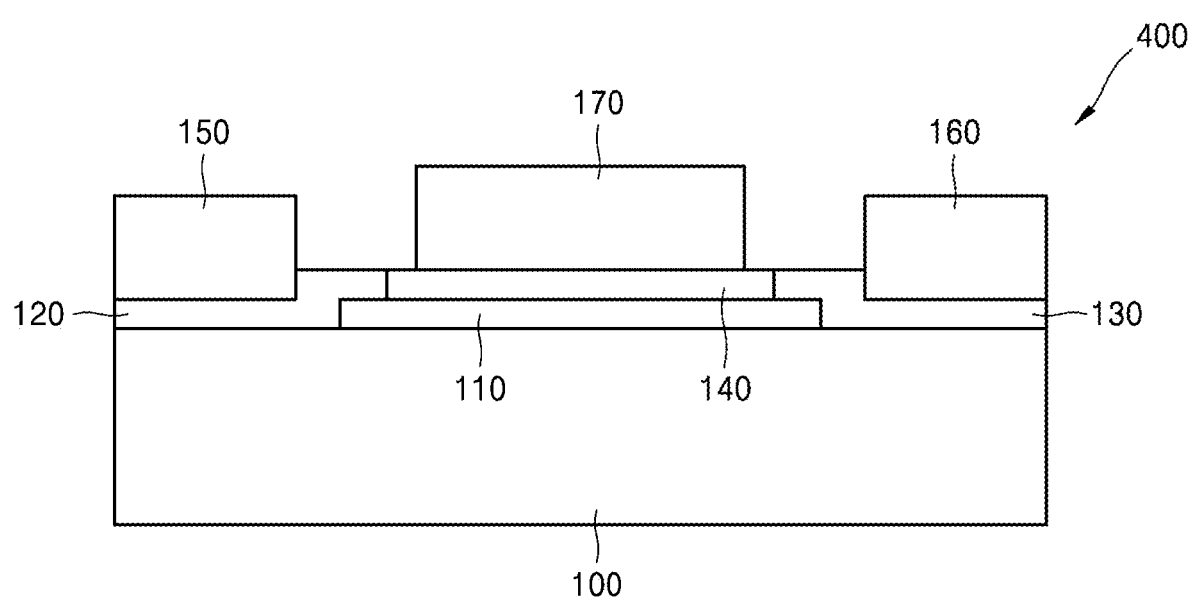

FIG. 4 shows a second transistor 400. Only a portion different from the first transistor 300 of FIG. 3 is described.

As shown in FIG. 4, the first 2D material layer 110 partially overlaps the second and third 2D material layers 120 and 130. In other words, the second 2D material layer 120 extends onto a partial area of the first 2D material layer 110. Accordingly, a portion of the first 2D material layer 110 is covered by the second 2D material layer 120. The extending portion of the second 2D material layer 120 is located between the source electrode 150 and the insulating layer 140, and thus the source electrode 150 and the insulating layer 140 are spaced apart from each other. Also, the second 2D material layer 120 is in direct contact with the insulating layer 140 on the first 2D material layer 110. The third 2D material layer 130 extends onto a partial area of the first 2D material layer 110. Accordingly, a portion of the first 2D material layer 110, that is, a portion of the first 2D material layer 110 adjacent to the third 2D material layer 130 is covered by the third 2D material layer 130. An extending portion of the third 2D material layer 130 is located between the drain electrode 160 and the insulating layer 140, and thus the insulating layer 140 and the drain electrode 160 are spaced apart from each other. In addition, the third 2D material layer 130 is in direct contact with the insulating layer 140 on the first 2D material layer 110. As a result, both sides of the insulating layer 140 are in direct contact with the second and third 2D material layers 120 and 130.

Figure 5:
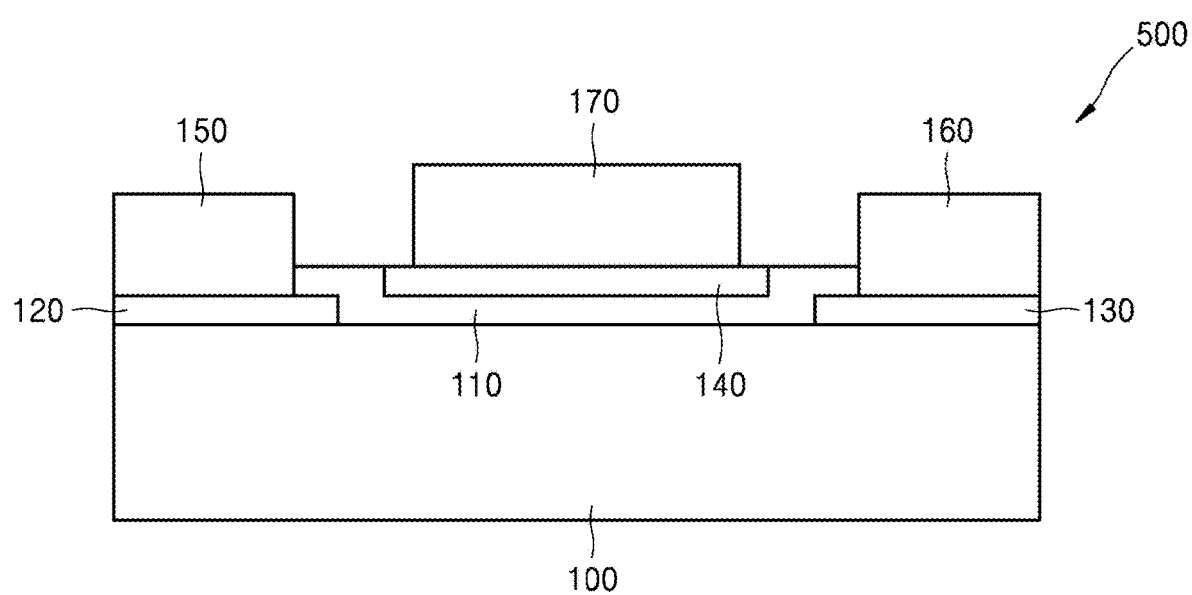

FIG. 5 shows a third transistor 500. Only a portion different from the first transistor 300 of FIG. 1 is described.

Referring to FIG. 5, both sides of the first 2D material layer 110 extend onto partial portions of the second and third 2D material layers 120 and 130, respectively. Accordingly, both sides of the first 2D material layer 110 overlap portions of the second and third 2D material layers 120 and 130. The source and drain electrodes 150 and 160 are separated from the insulating layer 140. An extending portion of the first 2D material layer 110 is located between the source and drain electrodes 150 and 160 and the insulating layer 140. The source and drain electrodes 150 and 160 are in direct contact with the extending portion of the first 2D material layer 110.

Figure 6:
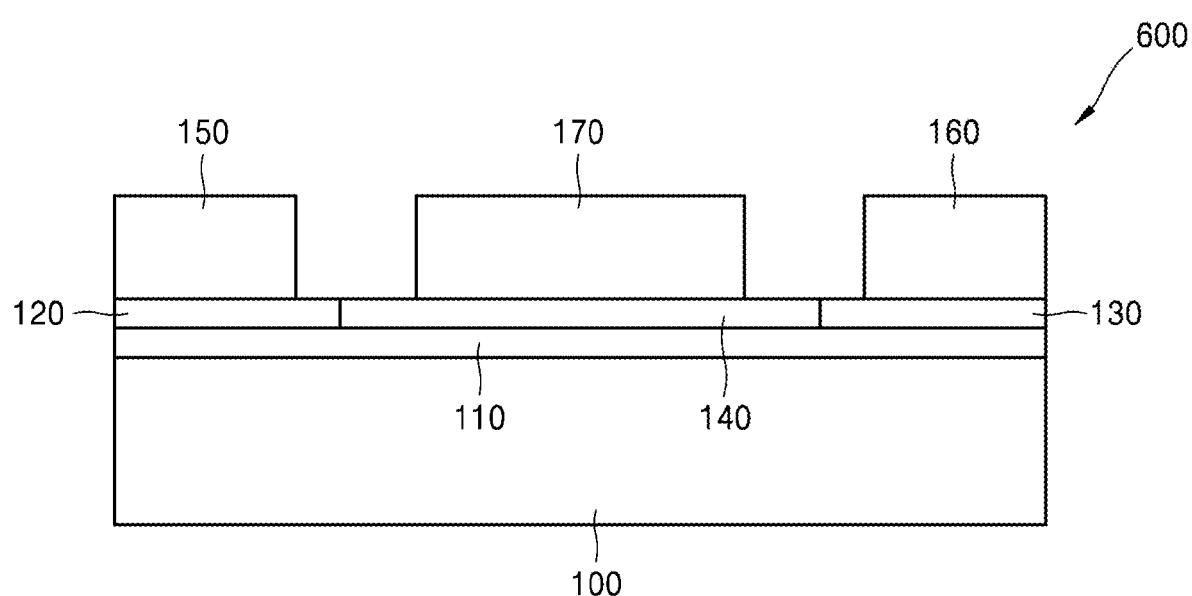

FIG. 6 shows a fourth transistor 600. Only a portion different from the first transistor 300 of FIG. 1 is described.

Referring to FIG. 6, the first 2D material layer 110 extends below the second and third 2D material layers 120 and 130. An upper surface of the substrate 100 is covered by the first 2D material layer 110. Both the second and third 2D material layers 120 and 130 are present on the first 2D material layer 110. Accordingly, a side where the source electrode 150 is placed has a layer structure in which the first 2D material layer 110, the second 2D material layer 120, and the source electrode 150 are sequentially stacked, and a side where the drain electrode 160 is placed has a layer structure in which the first 2D material layer 110, the third 2D material layer 130, and the drain electrode 160 are sequentially stacked.

Figure 7A:
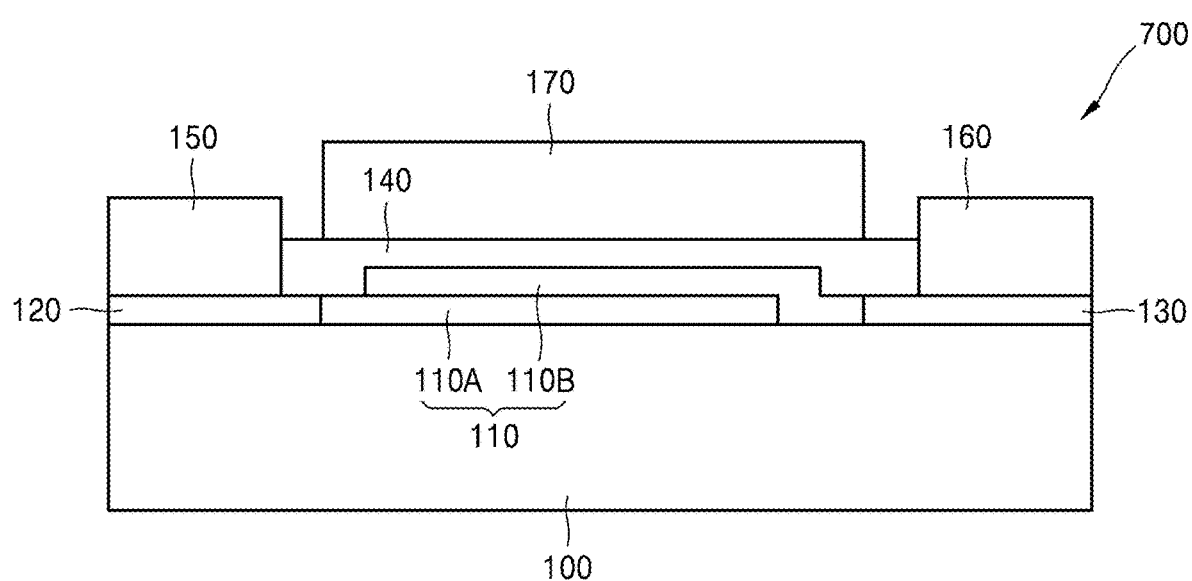
Figure 7B:
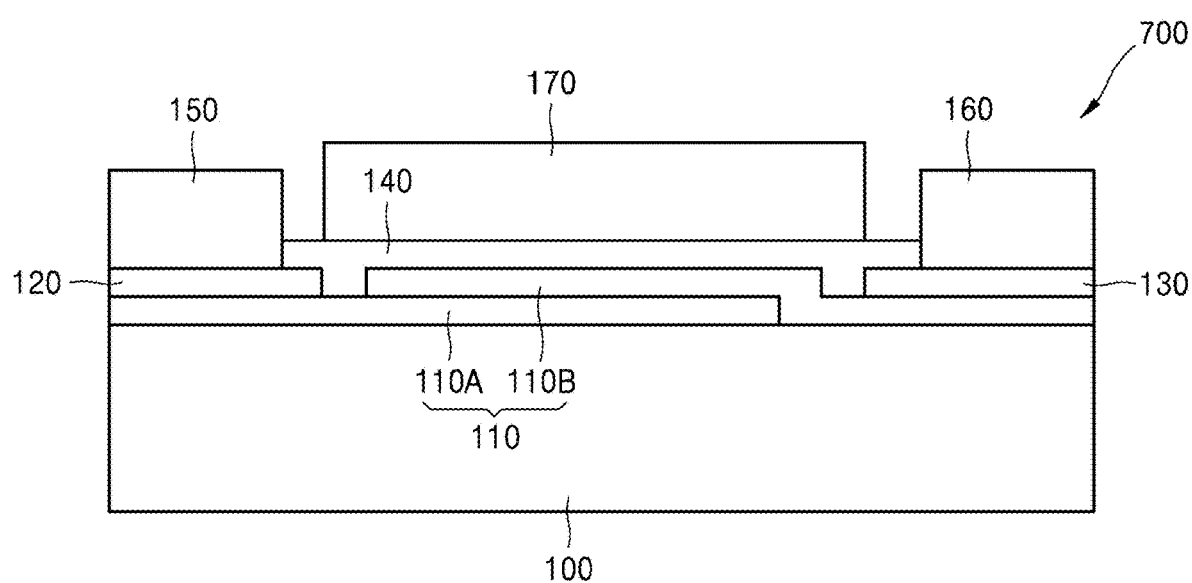

FIGS. 7A and 7B show a fifth transistor 700. Only a portion different from the first transistor 300 of FIG. 1 is described.

First, referring to FIG. 7A, the first 2D material layer 110, which is a channel layer, includes a first channel layer 110A and a second channel layer 110B that are sequentially stacked on the substrate 100. The first and second channel layers 110A and 110B may be the same 2D material layer as the wiring 10 of FIG. 1. A 2D material of the first channel layer 110A may be the same as or different from a 2D material of the second channel layer 110B. The first channel layer 110A is in contact with the second 2D material layer 120. However, the first channel layer 110A is separated from the third 2D material layer 130. The first channel layer 110A and the second channel layer 110B may partially overlap each other. The second channel layer 110B formed on the first channel layer 110A covers a portion of an upper surface of the first channel layer 110A. In some example embodiments, the second channel layer 110B may cover half or more of the upper surface of the first channel layer 110A. The second channel layer 110B extends to a right side of the first channel layer 110A to cover a right side surface of the first channel layer 110A, and covers the upper surface of the substrate 100 between the first channel layer 110A and the third 2D material layer 130. The extending second channel layer 110B is in direct contact with the third 2D material layer 130. The second channel layer 110B is separated from the second 2D material layer 120. The third 2D material layer 130 is spaced apart from the first channel layer 110A. A portion of the second channel layer 110B is present between the first channel layer 110A and the third 2D material layer 130. The portion of the second channel layer 110B may cover the entire upper surface of the substrate 100 exposed between the first channel layer 110A and the third 2D material layer 130. An arrangement relationship of the first and second channel layers 110A and 110B and the second and third 2D material layers 120 and 130 may be opposite. In other words, the first channel layer 110A may be directly connected to the third 2D material layer 130, and the second channel layer 110B may be directly connected to the second 2D material layer 120. The insulating layer 140 covers the entire first 2D material layer 110 between the source and drain electrodes 150 and 160.

As shown in FIG. 7B, the first channel layer 110A may extend below the second 2D material layer 120. Accordingly, the entire second 2D material layer 120 may be located on an extending portion of the first channel layer 110A. The second channel layer 110B may extend below the third 2D material layer 130. Accordingly, the entire third 2D material layer 130 may be located on an extending portion of the second channel layer 110B.

Figure 8A:
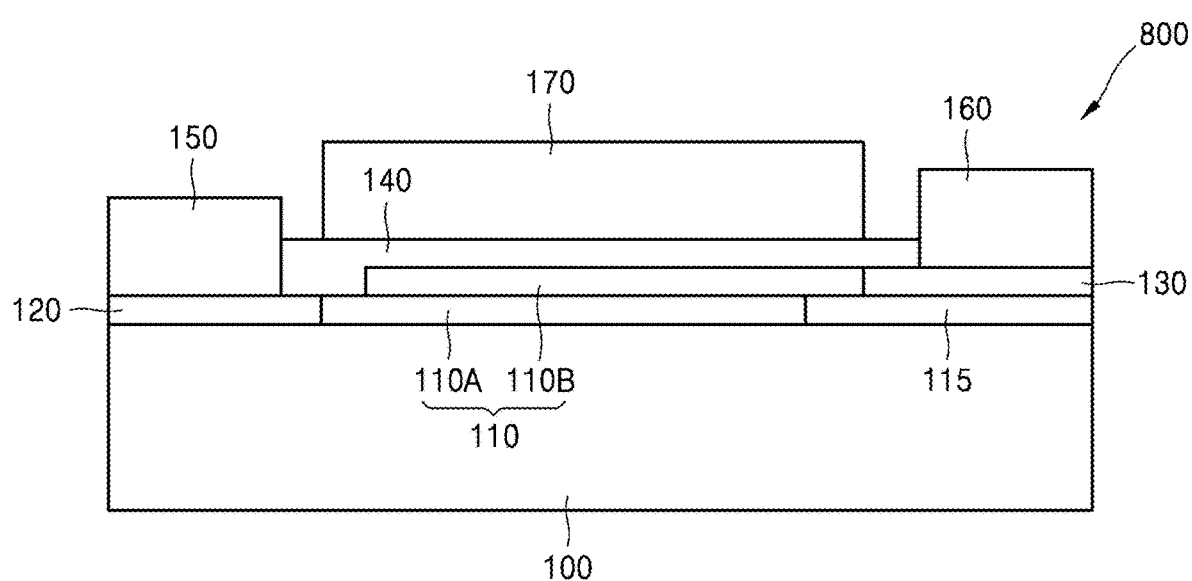
Figure 8B:
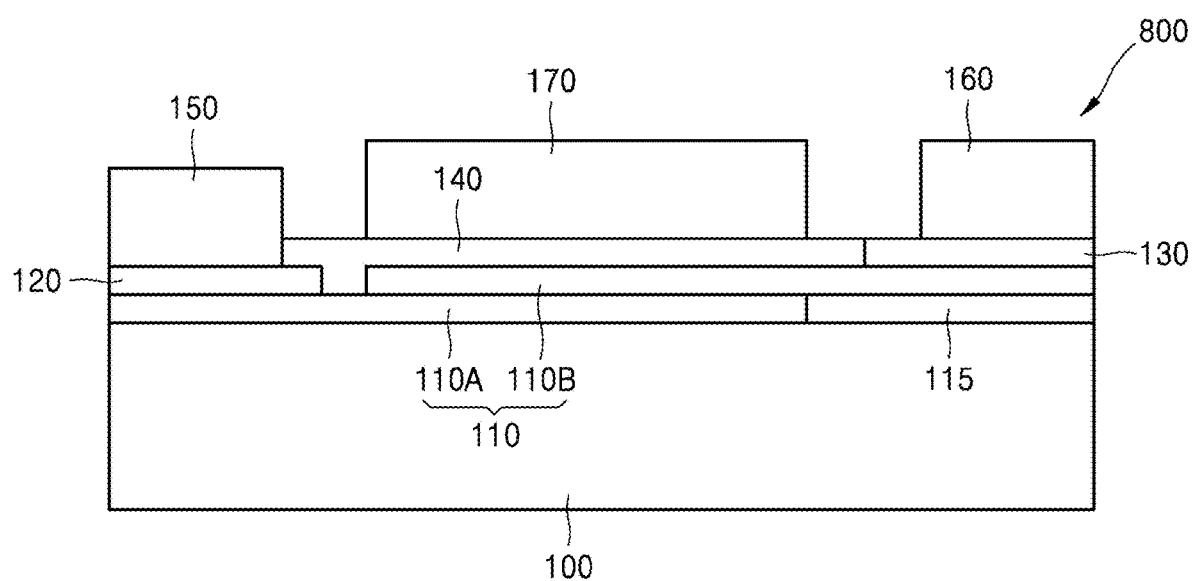

FIGS. 8A and 8B show a sixth transistor 800. Only a portion different from the fifth transistor 700 of FIGS. 7A and 7B is described.

Referring to FIG. 8A, an insulating layer 115 is present on the substrate 100 at a right side of the first channel layer 110A. The thickness of the insulating layer 115 may be the same as or different from the thickness of the first channel layer 110A. A portion of the second channel layer 110B extends onto a partial area of the insulating layer 115. The third 2D material layer 130 is present on the insulating layer 115. The second channel layer 110B and the third 2D material layer 130 are in contact with each other on the insulating layer 115.

As shown in FIG. 8B, the first channel layer 110A may extend below the second 2D material layer 120. The second channel layer 110B may extend below the third 2D material layer 130. In other words, the second channel layer 110B may extend between the third 2D material layer 130 and the insulating layer 115.

Figure 9:
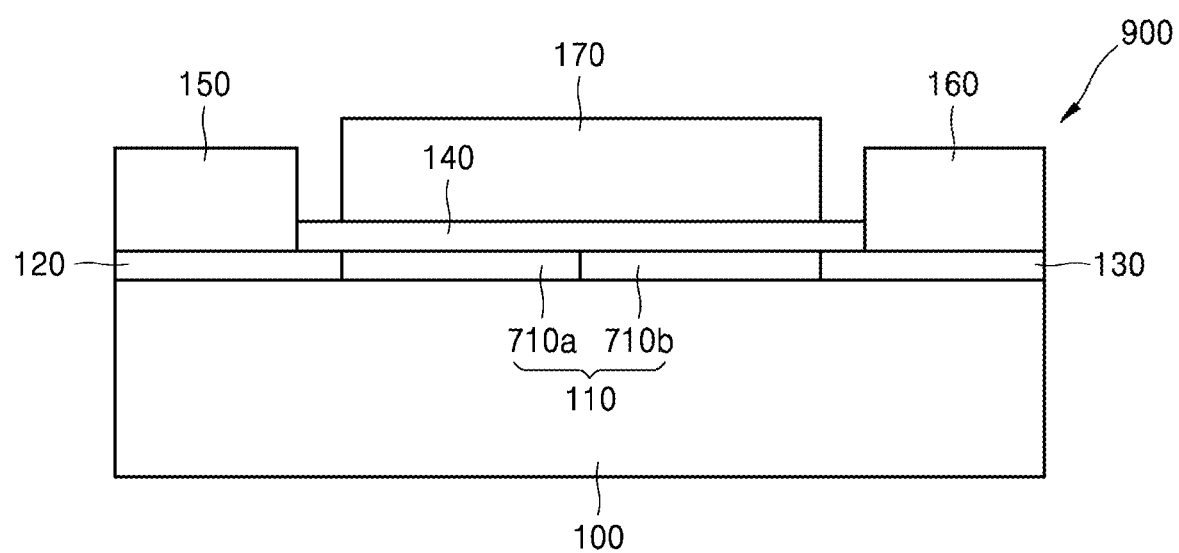

FIG. 9 shows a seventh transistor 900. Only a portion different from the first transistor 300 of FIG. 3 is described.

Referring to FIG. 9, the first 2D material layer 110 includes first and second channel layers 710a and 710b that are horizontally arranged on the same surface. The first channel layer 710a and the second channel layer 710b do not overlap each other, but are in direct contact with each other. In other words, a right side surface of the first channel layer 710a and a left side surface of the second channel layer 710b are in direct contact with each other. The first channel layer 710a may be the same 2D material layer as the wiring 10 of FIG. 1. The second channel layer 710b may be the same 2D material layer as the wiring 10 of FIG. 1. The first and second channel layers 710a and 710b may be the same 2D material layer or different 2D material layers from each other.

Figure 10:
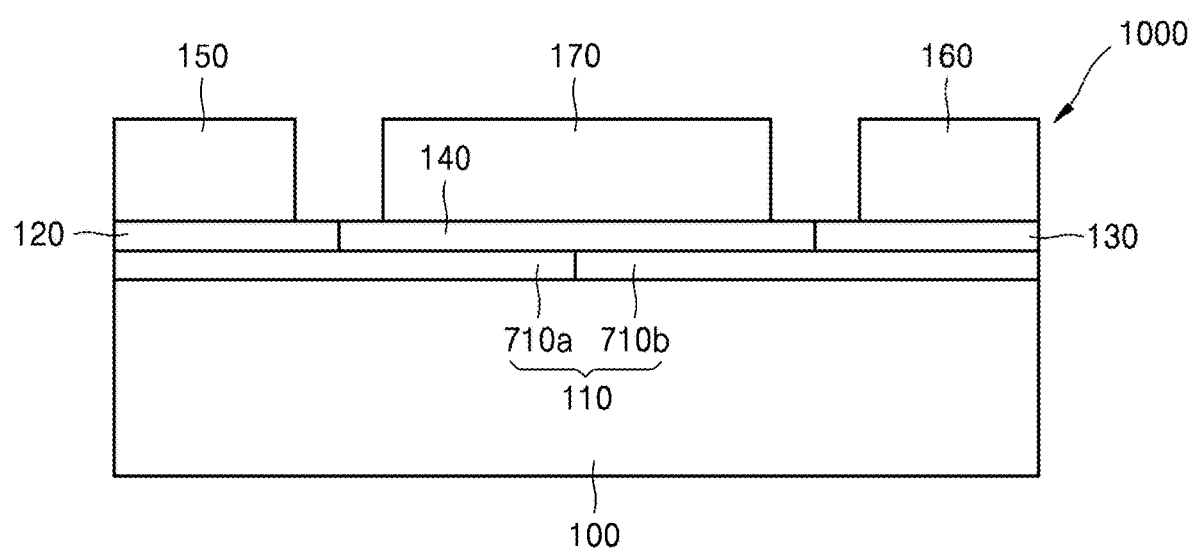

FIG. 10 shows an eighth transistor 1000. Only a portion different from the seventh transistor 900 of FIG. 9 is described.

Referring to FIG. 10, the first channel layer 710a extends below the second 2D material layer 120. Accordingly, the entire second 2D material layer 120 is provided on the first channel layer 710a. The second channel layer 710b extends below the third 2D material layer 130. Accordingly, the entire third 2D material layer 130 is provided on the second channel layer 710b.

Next, a method of manufacturing the electronic devices according to some example embodiments is described with reference to FIGS. 11, 12, 13, 14, 15, 16, 17, 18, 19, 20, 21, 22, 23, 24, 25, 26, and 27.

FIGS. 11, 12, 13, 14, 15, and 16 show a method of manufacturing the first transistor 300.

Figure 11:
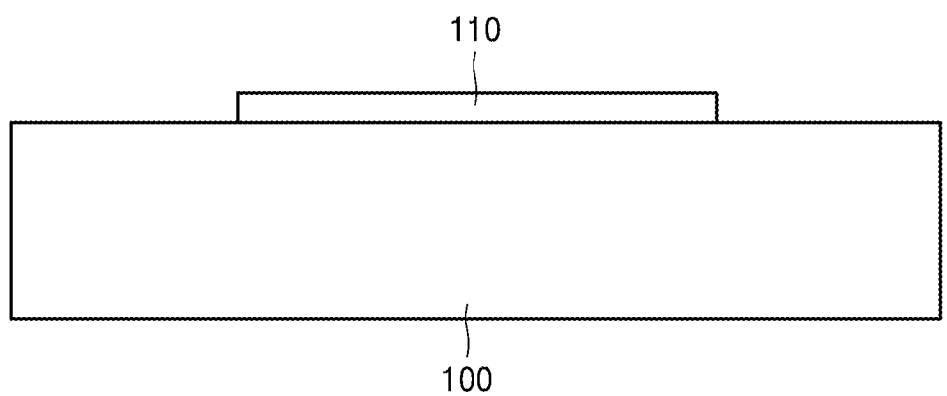
FIGS. 11, 12, 13, 14, 15, 16, 17, 18, 19, 20, 21, and 22 are cross-sectional views illustrating sequential operation of a manufacturing method regarding a portion of the electronic devices of FIGS. 3, 4, 5, 6, 7A, 7B, 8A, 8B, 9, and 10.

Referring to FIG. 11, the first 2D material layer 110 is formed on the substrate 100. The first 2D material layer 110 may be formed on a partial area of the upper surface of the substrate 100. In some example embodiments, the first 2D material layer 110 may be directly grown on the substrate 100 using a vapor deposition method. In some example embodiments, the first 2D material layer 110 may be formed by a method of transferring one grown on another substrate onto the substrate 100. In other words, the first 2D material layer 110 may be grown on another substrate and then transferred onto the substrate 100.

Figure 12:
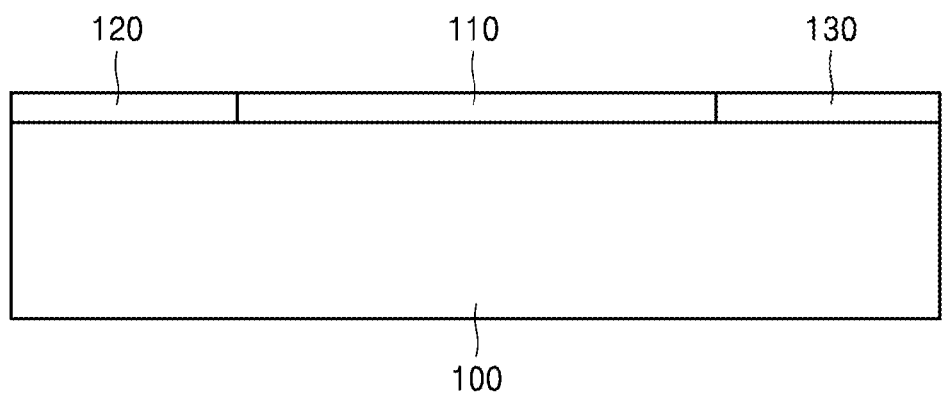

As shown in FIG. 12, the second and third 2D material layers 120 and 130 are formed on the substrate 100. The second and third 2D material layers 120 and 130 may be formed on both sides of the first 2D material layer 110. The second and third 2D material layers 120 and 130 may be formed by a growth method using a vapor deposition method. Like the first 2D material layer 110, the second and third 2D material layers 120 and 130 may also be formed by being directly grown on the substrate 100, or by transferring one grown on another substrate onto the substrate 100. The second 2D material layer 120 may be formed by being grown on a left side surface of the first 2D material layer 110. The third 2D material layer 130 may be formed by being grown on a right side surface of the first 2D material layer 110. When the first to third 2D material layers 110, 120, and 130 are formed, the thicknesses thereof may be formed to be the same, but is not limited thereto.

Figure 13:
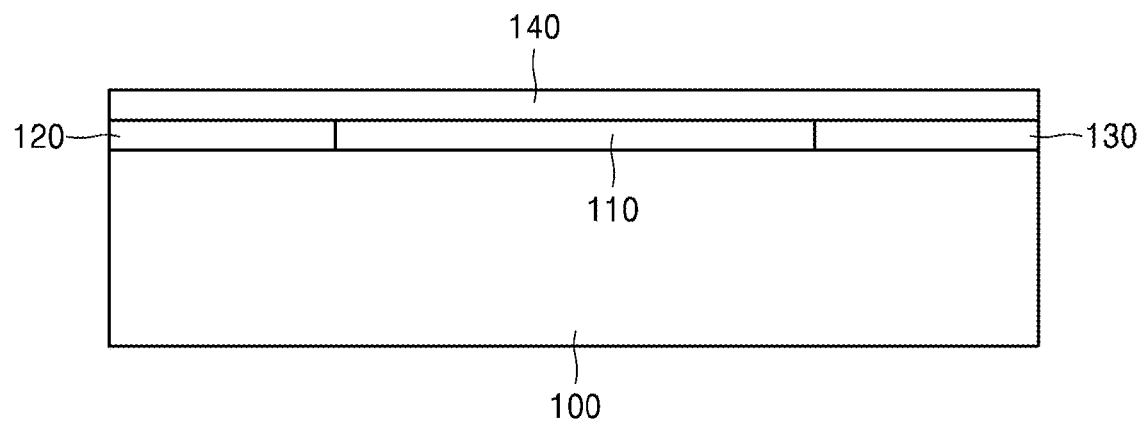
Figure 14:
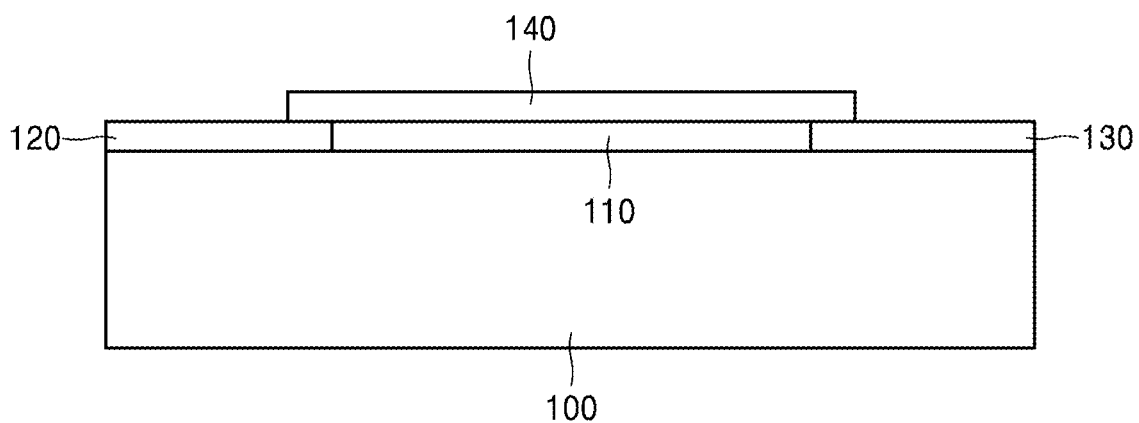

Next, as shown in FIG. 13, the insulating layer 140 covering the entire upper surface of the first to third 2D material layers 110, 120, and 130 is formed. Next, as shown in FIG. 14, the insulating layer 140 is patterned, that is, a portion of the insulating layer 140 is etched to expose a portion of the second 2D material layer 120 and a portion of the third 2D material layer 130. The etching of the insulating layer 140 may be performed until the second and third 2D material layers 120 and 130 are exposed. After the etching, the insulating layer 140 covers the entire first 2D material layer 110 and portions of the second and third 2D material layers 120 and 130.

Figure 15:
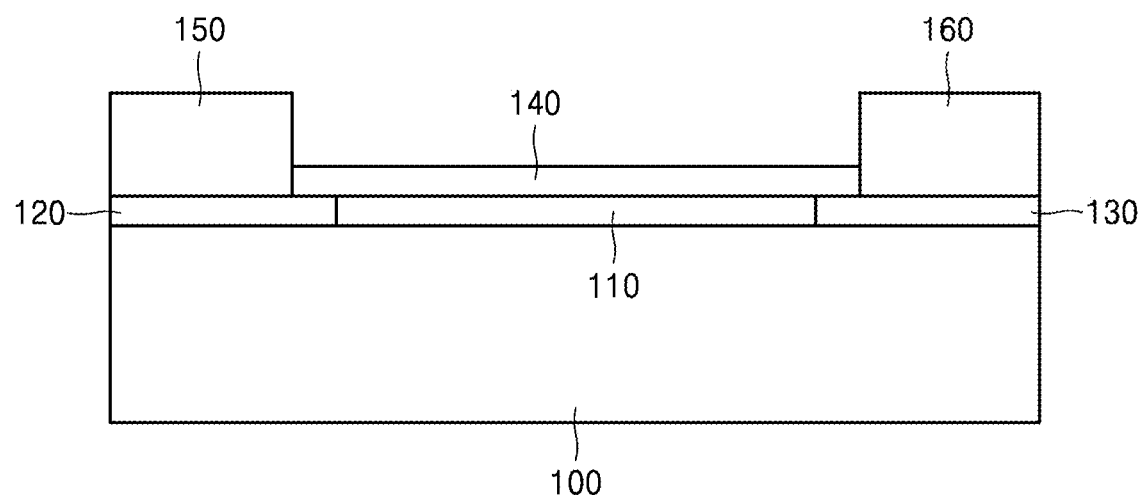

Next, as shown in FIG. 15, the source electrode 150 and the drain electrode 160 being in contact with the insulating layer 140 are formed on exposed areas of the second and third 2D material layers 120 and 130, respectively. The source and drain electrodes 150 and 160 may be formed while a mask used to etch the insulating layer 140 remains on the insulating layer 140. The mask may be removed after the source and drain electrodes 150 and 160 are formed.

Figure 16:
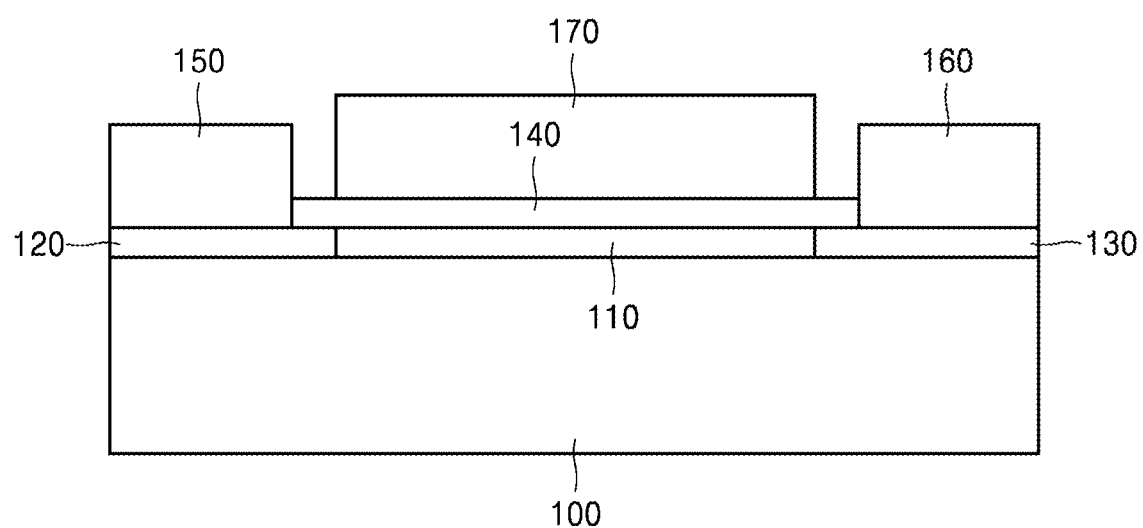

Next, as shown in FIG. 16, a gate electrode 170 is formed on the insulating layer 140 between the source and drain electrodes 150 and 160. In this way, the first transistor 300 is formed.

Figure 17:
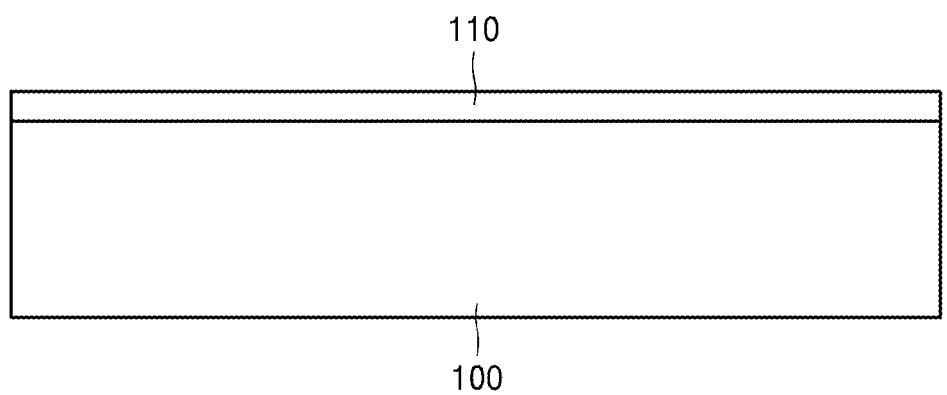
Figure 18:
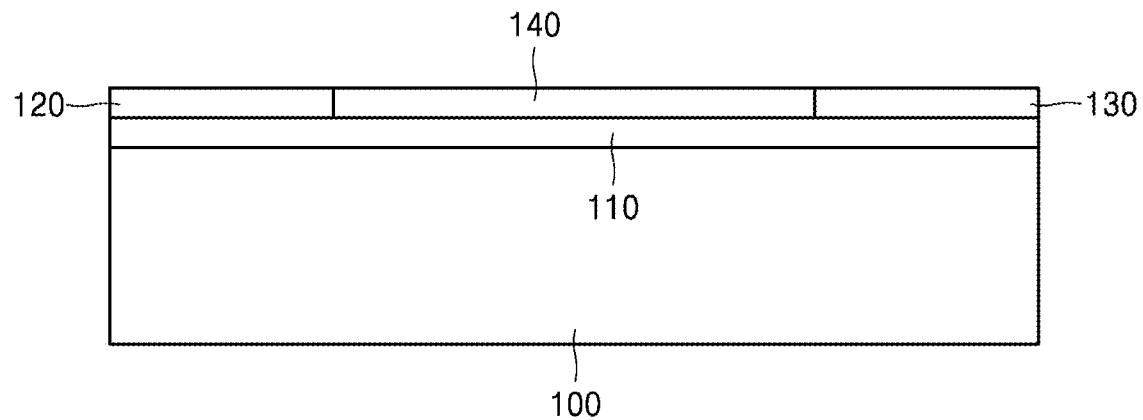
Figure 19:
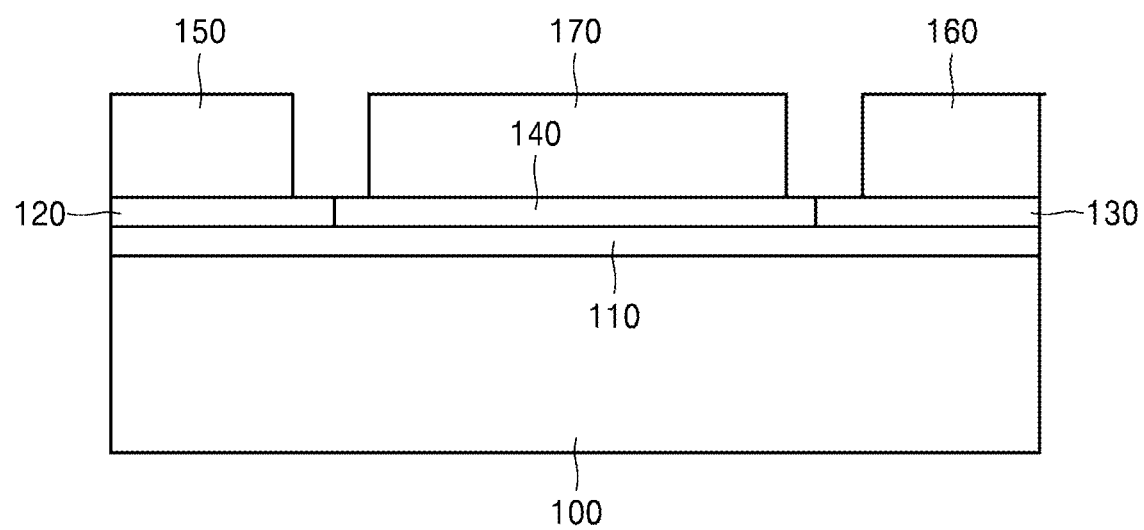

FIGS. 17, 18, and 19 show sequential operation of a method of manufacturing the fourth transistor 600.

As shown in FIG. 17, the first 2D material layer 110 is formed on the entire upper surface of the substrate 100.

Next, as shown in FIG. 18, the insulating layer 140 is formed on a partial area of the first 2D material layer 110. The second and third 2D material layers 120 and 130 are formed on the first 2D material layer 110 at both sides of the insulating layer 140. A portion of the insulating layer 140 may be formed on the second 2D material layer 120 and the third 2D material layer 130. The second and third 2D material layers 120 and 130 may be formed by a vertically and directly growing method on the first 2D material layer 100 or by a method of transferring one grown on another substrate.

Next, as shown in FIG. 19, the source electrode 150 and the drain electrode 160 are formed on the second and third 2D material layers 120 and 130, respectively, and the gate electrode 170 is formed on the insulating layer 140. In this way, the fourth transistor 600 is formed.

Figure 20:
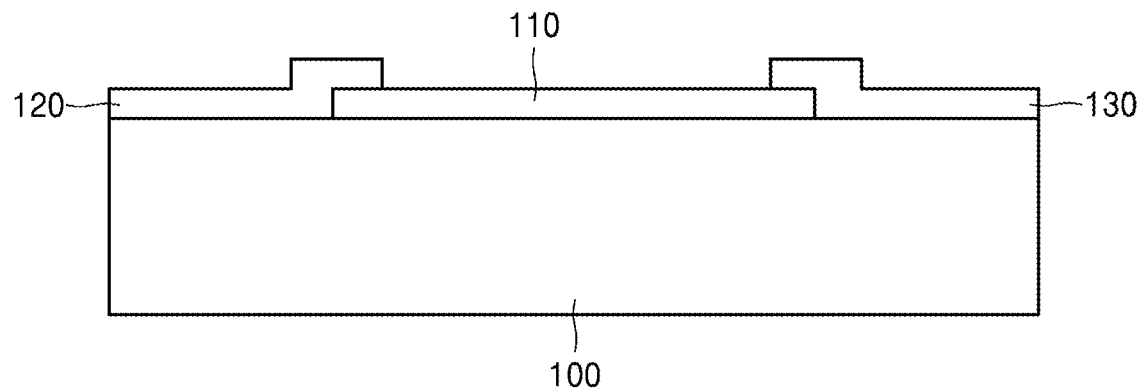
Figure 21:
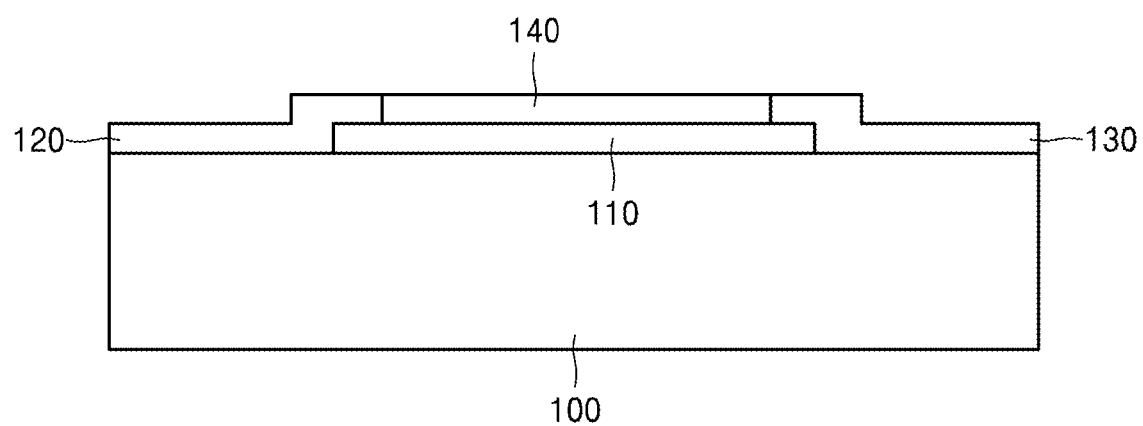
Figure 22:
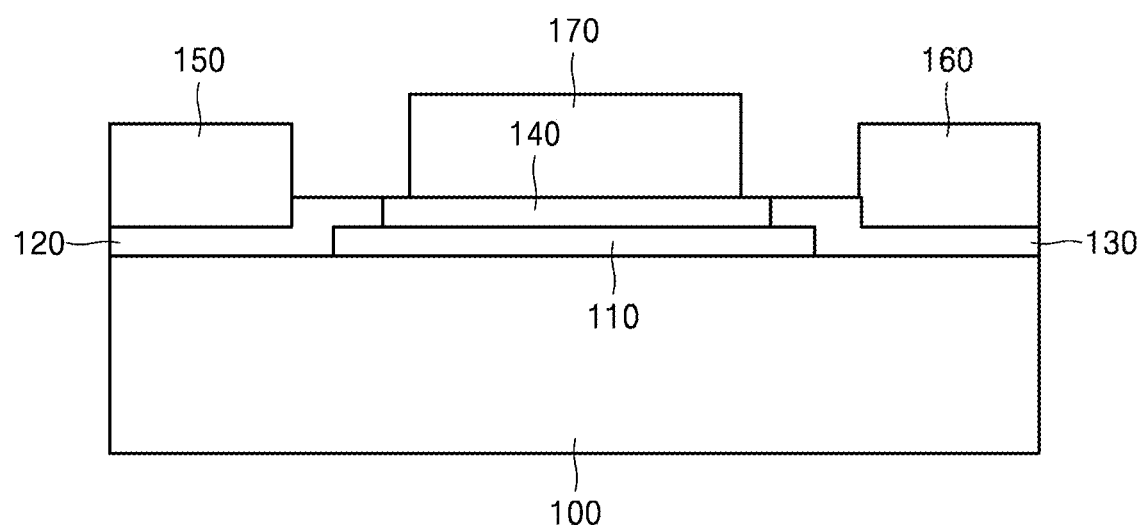

FIGS. 20, 21, and 22 show sequential operation of a method of manufacturing the second transistor 400.

Referring to FIG. 20, the first 2D material layer 110 is formed on a partial area of the upper surface of the substrate 100. The second 2D material layer 120 is formed on a left side of the first 2D material layer 110, and the third 2D material layer 130 is formed on a right side thereof. The second 2D material layer 120 is formed to cover a portion of the first 2D material layer 110, and the third 2D material layer 130 is also formed to cover a portion of the first 2D material layer 110. In an operation of growing the second and third 2D material layers 120 and 130, growth rates in horizontal and vertical directions may be adjusted to obtain a result of growing portions of the second and third 2D material layers 120 and 130 onto the first 2D material layer 110, as shown in FIG. 20.

Next, as shown in FIG. 21, the insulating layer 140 is formed on the first 2D material layer 110 between the second and third 2D material layers 120 and 130. Next, as shown in FIG. 22, the source and drain electrodes 150 and 160 are formed on the second and third 2D material layers 120 and 130, respectively, and the gate electrode 170 is formed on the insulating layer 140. In this way, the second transistor 400 of FIG. 4 is formed.

The fifth transistor 700 of FIGS. 7A and 7B may be formed by sequentially stacking the first channel layer 110A and the second channel layer 110B on the substrate 100 in an operation of forming the channel layer 110 of FIG. 11.

Also, in an operation of forming the second transistor 400 of FIG. 4, instead of the second and third 2D material layers 120 and 130, a portion of the first 2D material layer 110 may be grown onto the second and third 2D material layers 120 and 130 by adjusting horizontal and vertical growth rates of the first 2D material layer 110, and thus, the third transistor 500 of FIG. 5 may be formed.

The seventh transistor 900 of FIG. 9 may be formed by dividing the first 2D material layer 110 into two portions 710a and 710b and horizontally growing the same, in an operation of forming the first transistor 300, and the eighth transistor 1000 of FIG. 10 may be formed by firstly forming the two portions 710a and 710b and then growing the second 2D material layer 120 and the third 2D material layer 130 on each of the portions.

Figure 23:
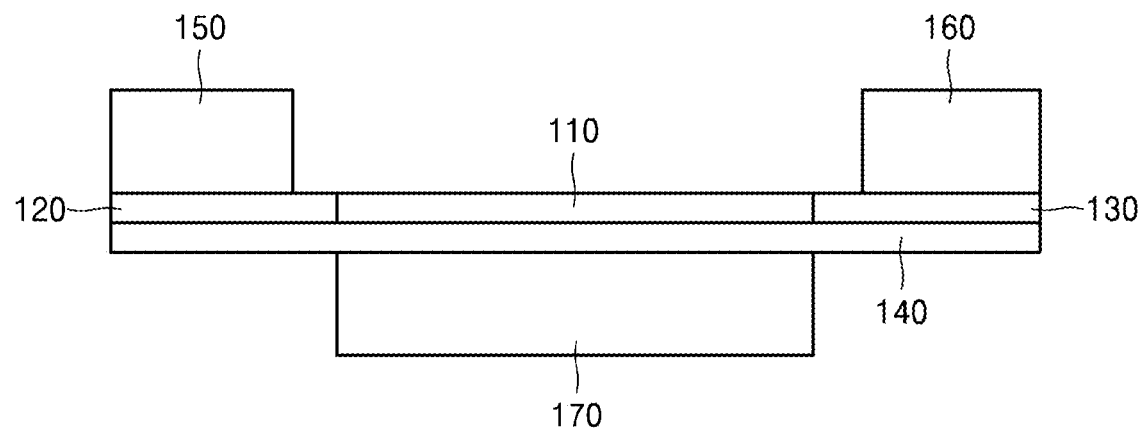
FIG. 23 is a cross-sectional view illustrating a bottom gate structure of a transistor of FIG. 3.
Figure 24:
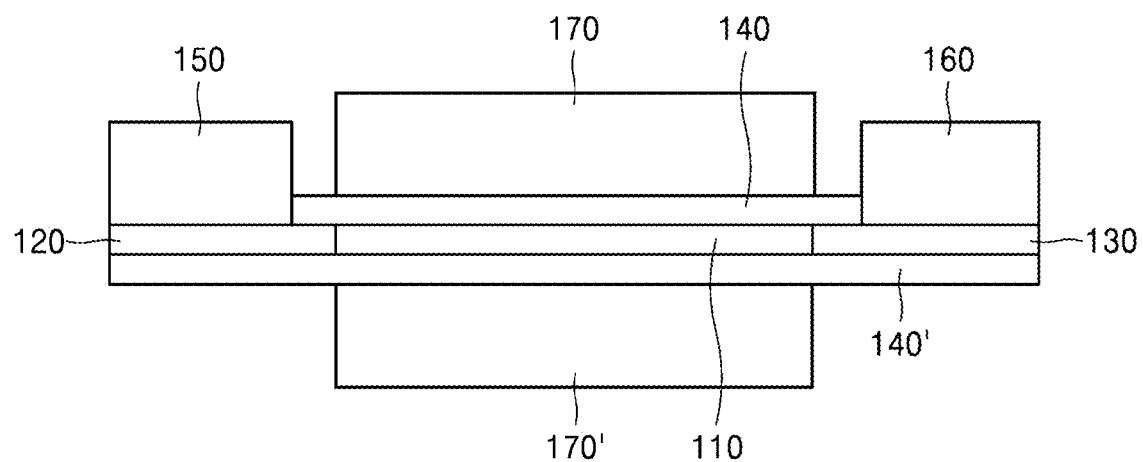
FIG. 24 is a cross-sectional view illustrating a bottom gate structure of a transistor of FIG. 3.

Meanwhile, the above-described transistors all have a top gate structure in which the gate electrode 170 is arranged on a channel, but are not limited thereto, and a bottom gate structure in which the gate electrode 170 is arranged below the channel is possible. FIG. 23 shows an example for one described above. FIG. 23 shows the first transistor 300 modified into a bottom gate structure. Also, a dual-gate structure in which transistor includes a top gate and a bottom gate is possible. FIG. 24 shows the first transistor 300 modified into a dual gate structure, where the transistor further includes an insulating layer 140' below the channel layer 110, second 2D material layer 120, and third 2D material layer 130. The transistor in FIG. 24 further includes a bottom gate electrode 170' connected to a lower surface of the insulating layer 140'.

While FIGS. 23 and 24 illustrate modified examples where the transistor 300 is FIG. 3 may be modified into a bottom gate transistor as shown in FIG. 23 or a dual-gate transistor as shown in FIG. 24, example embodiments are not limited thereto. The transistors 400, 500, 600, 700, 800, 900, and 1000 in FIGS. 4-6, 7A, 7B, 8A, 8B, 9, and 10 discussed above may be modified similarly to provide bottom gate and dual-gate modifications of the transistors 400, 500, 600, 700, 800, 900, and 1000 discussed above.

In the disclosed electronic devices according to example embodiments, a 2D wiring (or channel) and a conductive layer being in contact therewith may be in contact with each other via a 2D material. Accordingly, a contact resistance between the 2D wiring and the conductive layer in contact therewith decreases, and thus, operation characteristics of the electronic device may be enhanced, such as an increase in a carrier mobility. In addition, the technology applied to the disclosed electronic device may promote the development of various electronic devices based on a 2D material, which has been depressed due to contact resistance problems.

It should be understood that some example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope of inventive concepts as defined by the following claims.

What is claimed is:

1. A semiconductor device, comprising:
a semiconducting 2D material layer;
a conductive layer on the semiconducting 2D material layer; and
a metallic 2D material layer between the semiconducting 2D material layer and the conductive layer, the metallic 2D material layer being in contact with the semiconducting 2D material layer and the conductive layer,
wherein the semiconducting 2D material layer and the metallic 2D material layer include a same material, and phases of materials of the semiconducting 2D material layer and the metallic 2D material layer are different from each other.

2. The semiconductor device of claim 1, wherein the semiconducting 2D material layer includes a transition metal dichalcogenide (TMD) or black phosphorene (BP).

3. The semiconductor device of claim 1, wherein the semiconducting 2D material layer has a preset doping concentration.

4. The semiconductor device of claim 1, wherein the metallic 2D material layer is configured to exhibit metallicity, metallicity, or superconductivity.

5. The semiconductor device of claim 1, wherein
the conductive layer directly contacts a first surface of the metallic 2D material layer,
the semiconducting 2D material layer and the metallic 2D material layer include edge surfaces,
the edge surface of the semiconducting 2D material layer directly contacts the edge surface of the metallic 2D material layer, and the first surface of the metallic 2D material layer is different than the edge surface of the metallic 2D material layer.

6. The semiconductor device of claim 1, wherein the metallic 2D material layer includes graphene.

7. The semiconductor device of claim 1, further comprising a substrate, wherein the semiconducting 2D material layer is on a surface of the substrate and the metallic 2D material layer is on the surface of the substrate.

8. The semiconductor device of claim 7, wherein the metallic 2D material layer comprises a second material layer and a third material layer, the second material layer and the third material layer each being a metallic material layer, with at least a portion of the semiconducting 2D material layer between the second material layer and the third material layer in a direction parallel to the surface of the substrate.

9. The semiconductor device of claim 8, further comprising an insulating layer on the semiconducting 2D material layer.

10. The semiconductor device of claim 9, further comprising
a gate electrode on the insulating layer,
wherein the conductive layer comprises a source electrode on the second material layer and a drain electrode on the third material layer.

11. The semiconductor device of claim 10, wherein the semiconducting 2D material layer comprises a first channel layer and a second channel layer.

12. The semiconductor device of claim 11, wherein one of the first channel layer and the second channel layer contacts the second material layer and the other of the first channel layer and the second channel layer contacts the third material layer.

13. The semiconductor device of claim 12, wherein the first channel layer and the second channel layer are vertically stacked.

14. The semiconductor device of claim 12, wherein the first channel layer and the second channel layer are arranged in parallel not to horizontally overlap each other.

15. The semiconductor device of claim 8, wherein the semiconducting 2D material layer partially overlaps the second material layer and the third material layer.

16. The semiconductor device of claim 8, wherein the second material layer is a second 2D material layer and the third material layer is a third 2D material layer.

17. The semiconductor device of claim 16, wherein the second 2D material layer and the third 2D material layer comprise a same 2D material.

18. The semiconductor device of claim 9, wherein the semiconducting 2D material layer extends below both the second material layer and the third material layer.

19. The semiconductor device of claim 10, wherein the semiconducting 2D material layer contacts both the insulating layer and the substrate.

* * * * *